(12) United States Patent
Isobe

(10) Patent No.: US 7,076,747 B2
(45) Date of Patent: Jul. 11, 2006

(54) ANALYTICAL SIMULATOR AND ANALYTICAL SIMULATION METHOD AND PROGRAM

(75) Inventor: Shinobu Isobe, Tateyama (JP)

(73) Assignee: UMC Japan, Chiba-Ken (JP)

( * ) Notice: Subject to any disclaimer, the term of this patent is extended or adjusted under 35 U.S.C. 154(b) by 144 days.

(21) Appl. No.: 10/302,035

(22) Filed: Nov. 22, 2002

(65) Prior Publication Data

US 2003/0145293 A1    Jul. 31, 2003

(30) Foreign Application Priority Data

Jan. 31, 2002    (JP)    ............................. 2002-024133

(51) Int. Cl.
*G06F 17/50*    (2006.01)
(52) U.S. Cl. .................................. 716/4; 716/5; 716/6
(58) Field of Classification Search ................. 716/4–6, 716/18; 714/25–26, 738–741; 324/763–765
See application file for complete search history.

(56) References Cited

U.S. PATENT DOCUMENTS

| | | | | |
|---|---|---|---|---|
| 5,248,937 A | * | 9/1993 | Holzle | 324/158.1 |
| 5,345,393 A | * | 9/1994 | Ueda | 716/18 |
| 5,384,720 A | * | 1/1995 | Ku et al. | 703/16 |
| 5,446,724 A | * | 8/1995 | Tabe et al. | 369/275.1 |
| 5,592,614 A | * | 1/1997 | Peters | 714/26 |
| 5,650,947 A | * | 7/1997 | Okumura | 703/16 |
| 6,249,893 B1 | * | 6/2001 | Rajsuman et al. | 714/741 |
| 6,487,700 B1 | * | 11/2002 | Fukushima | 716/4 |
| 6,536,031 B1 | * | 3/2003 | Ito et al. | 716/18 |
| 6,665,268 B1 | * | 12/2003 | Sato et al. | 370/242 |
| 2002/0093356 A1 | * | 7/2002 | Williams et al. | 324/765 |

FOREIGN PATENT DOCUMENTS

| | | |
|---|---|---|
| JP | 01-131470 | 5/1989 |
| JP | 06-194418 | 7/1994 |
| JP | 07-055887 | 3/1995 |
| JP | 8-146093 | 6/1996 |
| JP | 10-214277 | 8/1998 |
| JP | 11-044735 | 2/1999 |
| JP | 2000-46917 | 2/2000 |
| JP | 2000-113006 | 4/2000 |
| JP | 2001-174527 | 6/2001 |
| JP | 2001-208809 | 8/2001 |

* cited by examiner

*Primary Examiner*—Vuthe Siek
*Assistant Examiner*—Naum Levin
(74) *Attorney, Agent, or Firm*—Cohen, Pontani, Lieberman & Pavane

(57) ABSTRACT

An analytical simulator and analytical simulation method and program for determining a defective portion in a device in a short time without requiring a high level of experience and skill. The simulator has a design section for designing the device based on predetermined design data including design specification data; a test result tool for receiving results of a test on the device as an object to be analyzed, where the device is designed by the design section and is produced based on the design; and an analysis section for comparing each test result with an expected output value of the object to be analyzed, where the expected output value is calculated by the design section, and for determining a range including a defective portion in the object to be analyzed, based on results of the comparison.

8 Claims, 2 Drawing Sheets

| INPUT CONDITION | | | OUTPUT | |
|---|---|---|---|---|
| A | B | C | B2 | D |
| 0 | 0 | 0 | UNCHANGED (PREVIOUS VALUE) | 1 |
| 0 | 0 | 1 | 0 | 1 |
| 0 | 1 | 0 | UNCHANGED (PREVIOUS VALUE) | 1 |
| 0 | 1 | 1 | 1 | 1 |
| 1 | 0 | 0 | UNCHANGED (PREVIOUS VALUE) | × |
| 1 | 0 | 1 | 0 | 1 |
| 1 | 1 | 0 | UNCHANGED (PREVIOUS VALUE) | × |
| 1 | 1 | 1 | 1 | 0 ~E |

ANALYTICAL SIMULATOR AND ANALYTICAL SIMULATION METHOD AND PROGRAM

BACKGROUND OF THE INVENTION

1. Field of the Invention

The present invention relates to an analytical simulator and to an analytical simulation method and program used for analyzing failure in an electronic circuit or the like, and in particular, relates to those suitably used for analyzing failure in a semiconductor device.

2. Description of the Related Art

Conventionally, a failure analysis method for detecting a defective portion in a semiconductor device is known, in which a specific signal is input into a logic circuit of the semiconductor device, and the output signal from the logic circuit is electrically measured. If this electrically-measured output signal (i.e., observed value) does not coincide with a logically-calculated output signal (i.e., expected output value) corresponding to the input signal, then it is determined that the logic circuit is defective.

Generally, the logic circuit of the semiconductor device is divided into blocks and a test pattern as an input signal for each block is prepared in advance. The expected output value and the observed value are compared with each other for each block, thereby roughly determining the portion which has a defect. In addition, the output signal is measured by (i) making a needle directly contact the wiring of the logic circuit, or (ii) using an electronic-beam tester for performing non-contact measurement.

However, in order to accurately determine the portion which has a defect in the logic circuit of the semiconductor device, the target portion at which the output signal is measured should be experimentally estimated, or the output signals should be measured at many portions. Therefore, skilled technique or a very long working time is necessary.

Accordingly, in order to accurately determine the portion which has a defect in the logic circuit of the semiconductor device, the logic circuit should be divided into many small circuits which correspond to different functions or the like, and a test pattern should be prepared as an input signal into each divided circuit. The output signal from each divided circuit should be measured so as to extract a target circuit which has a defect, and signals on wiring lines in the target circuit should be checked so as to detect the defective portion. Such determination of the defective portion is difficult and time-consuming, in particular, for semiconductor devices having complicated and large-scale logic circuits. That is, comparison between the expected output signal and the measured output signal must be repeated many times.

SUMMARY OF THE INVENTION

In consideration of the above circumstances, an object of the present invention is to provide an analytical simulator and analytical simulation method and program for determining a defective portion in a device in a short time without requiring a high level of experience and skill.

Therefore, the present invention provides an analytical simulator for designing and analyzing a device, comprising:

a design section for designing the device based on predetermined design data including design specification data;

a test result tool for receiving results of a test on the device as an object to be analyzed, where the device is designed by the design section and is produced based on the design; and an analysis section for comparing each test result with an expected output value of the object to be analyzed, where the expected output value is calculated by the design section, and for determining a range including a defective portion in the object to be analyzed, based on results of the comparison.

As a typical example, the design section includes a test pattern tool for producing a test pattern used in the test which is performed in the range determined by the analysis section;

the test result tool also receives data for indicating a limited range to be analyzed in the object; and the analysis section is realized by using at least one of the structural constituents of the design section and compares the test result with the expected output value with respect to the limited range indicated by the data.

In a concrete example, the design section includes:

a logic diagram tool for producing a logic diagram based on the design specification data;

a circuit diagram tool for producing a circuit diagram based on the logic diagram and on predetermined device parameters for realizing the device;

a layout diagram tool for producing a layout diagram based on the circuit diagram and on predetermined layout rules;

the test pattern tool; and the test result tool, and the analysis section includes at least one of the logic diagram tool, the circuit diagram too, the layout diagram tool, the test pattern tool, and the test result tool;

the logic diagram tool produces the logic diagram of the object to be analyzed, based on the range determined by the analysis section; and the layout diagram tool produces the layout diagram of the object to be analyzed, based on the range determined by the analysis section.

The analytical simulator may further comprise:

a display device for displaying the range including a defective portion, which is determined by the analysis section, by using at least one of a logic diagram, a circuit diagram, and a layout diagram.

The display device may also display the probability that the displayed range includes a defect.

The present invention also provides an analytical simulation method for designing and analyzing a device, comprising:

a design process of designing the device based on predetermined design data including design specification data;

a device producing process of producing the device based on the design in the design process;

a test result receiving process of receiving results of a test on the device as an object to be analyzed; and an analysis process of comparing each test result with an expected output value of the object to be analyzed, where the expected output value is calculated in the design process, and determining a range including a defective portion in the object to be analyzed, based on results of the comparison.

As a typical example, the design process includes:

a logic diagram producing process of producing a logic diagram based on the design specification data;

a circuit diagram producing process of producing a circuit diagram based on the logic diagram and on predetermined device parameters for realizing the device;

a layout diagram producing process of producing a layout diagram based on the circuit diagram and on predetermined layout rules;

a test pattern producing process of producing a test pattern used in the test, based on at least one of the design specification data, the logic diagram, the device parameters, the circuit diagram, the layout rules, the layout diagram, and predetermined data relating to specification of the test; and the test result receiving process, and wherein the test result receiving process includes also receiving data for indicating a limited range to be analyzed in the object;

the analysis process includes comparing the test result with the expected output value in the limited range by using the data which are used and produced in the design process, determining the range including a defective portion based on results of the comparison, and displaying the range by using at least one of the logic diagram, the circuit diagram, and the layout diagram; and the analysis process and the design process which includes the test result receiving process are repeatedly performed by defining the displayed range as the object to be analyzed.

The present invention also provides an analytical simulation program for designing and analyzing a device, the program making a computer execute an operation comprising:

a design step of designing the device based on predetermined design data including design specification data;

a test result receiving step of receiving results of a test on the device as an object to be analyzed, where the device is designed in the design step and is produced based on the design; and an analysis step of comparing each test result with an expected output value of the object to be analyzed, where the expected output value is calculated in the design step, and determining a range including a defective portion in the object to be analyzed, based on results of the comparison.

The operation may further comprises a device producing step of producing the device based on the design in the design step.

In a typical example, the design step includes:

a logic diagram producing step of producing a logic diagram based on the design specification data;

a circuit diagram producing step of producing a circuit diagram based on the logic diagram and on predetermined device parameters for realizing the device;

a layout diagram producing step of producing a layout diagram based on the circuit diagram and on predetermined layout rules;

a test pattern producing step of producing a test pattern used in the test, based on at least one of the design specification data, the logic diagram, the device parameters, the circuit diagram, the layout rules, the layout diagram, and predetermined data relating to specification of the test; and the test result receiving step, and wherein the test result receiving step includes also receiving data for indicating a limited range to be analyzed in the object;

the analysis step includes comparing the test result with the expected output value in the limited range by using the data which are used and produced in the design step, determining the range including a defective portion based on results of the comparison, and displaying the range by using at least one of the logic diagram, the circuit diagram, and the layout diagram; and the analysis step and the design step which includes the test result receiving step are repeatedly performed by defining the displayed range as the object to be analyzed.

According to the present invention, the device designed by the design section is tested as a target object to be analyzed, and the output of each test and the output value calculated for the target object by the design section are compared with each other. The defective portion of the target object is determined based on the results of tests. Therefore, a defective portion of a device can be accurately determined in a short time without requiring a high level of experience and skill, thereby efficiently designing the device and overcoming failure of the device in a short time.

DESCRIPTION OF THE PREFERRED EMBODIMENTS

Hereinafter, embodiments according to the present invention will be explained with reference to the drawings.

According to the present invention, a design simulator used for the circuit design is improved so as to automatically detect and indicate a defective portion in a complete circuit as a design product, thereby efficiently performing the circuit design and removal of the defective portion in a short time.

In the following embodiment, the electronic circuit of a semiconductor device is used for a target for the design and the removal of defects (i.e., target to be analyzed); however, the present invention is not limited to such a circuit, and other kinds of circuits or logic portions in other devices or methods may be analyzed.

STRUCTURE OF EMBODIMENT

Figure 1:
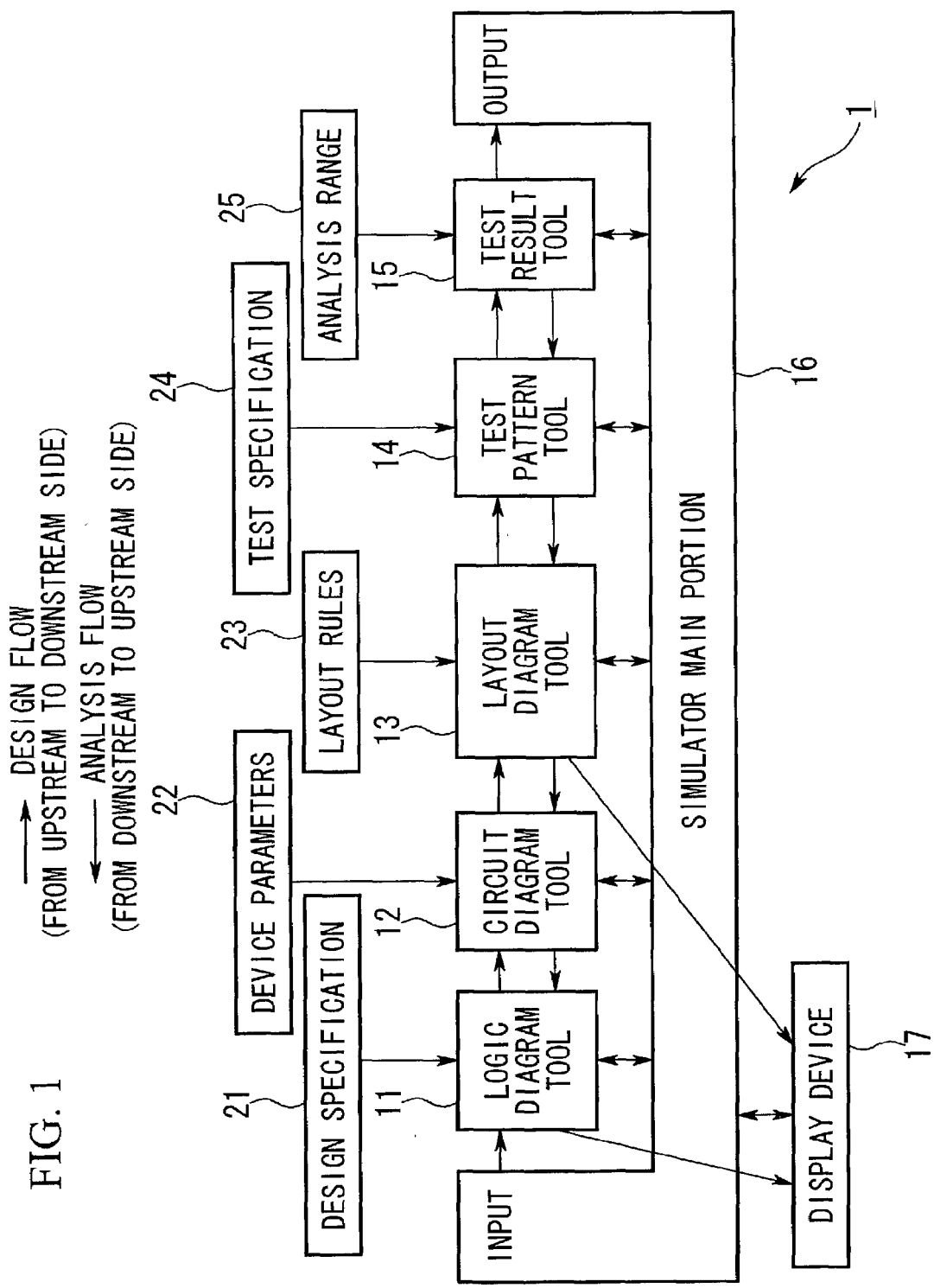
FIG. 1 is a block diagram showing the structure of an analytic simulator as an embodiment according to the present invention.

FIG. 1 is a block diagram showing the structure of an analytic simulator of the present embodiment.

The analytic simulator 1 in the diagram is used, typically, for virtually making a logic circuit, which will be provided on a semiconductor substrate, by software or the like, and for virtually operating the virtual circuit so as to verify whether results corresponding to the design specification (i.e., specific output values corresponding to specific input values) can be obtained. This is a function of a design section of the analytic simulator 1, which is implemented in the design flow (or design process).

The analytic simulator 1 also has a function of determining and indicating a defective portion in the logic circuit which is actually provided on a semiconductor substrate, based on results of a test for the logic circuit, and the like. That is, the analytic simulator 1 also includes a section for comparing the specific output value, which is calculated by the design section, with the test result for the logic circuit which is actually provided on a semiconductor substrate, and for determining an area including the defective portion in the logic circuit based on the compared result. That is, this is the function of an analysis section, which is implemented in the analysis flow (or analysis process).

Therefore, the analytic simulator 1 has a design section for assisting in the design and manufacturing of the device and the analyzing section for analyzing the produced device so as to determine the defective portion.

More specifically, the analytic simulator 1 has a logic diagram tool 11, a circuit diagram tool 12, a layout diagram tool 13, a test pattern tool 14, a test result tool 15, a simulator main portion 16, and a display device 17. These elements are constituents for both the design and analysis sections.

The logic diagram tool 11 is used for virtually producing a logic diagram or formula (called the "logic diagram" hereinbelow) on a software or hardware resource, based on a design specification 21 (corresponds to the design specification data in the present invention) which is prepared in advance. That is, the logic diagram tool 11 is used for virtually operating the virtually-produced logic diagram so as to verify whether the operation corresponds to the design specification 21.

The circuit diagram tool 12 is used for virtually producing a circuit diagram based on the logic diagram, which is virtually produced and verified by the logic diagram tool 11, and on electronic device parameters 22 which are used for realizing the logic diagram as an electronic circuit. That is, the circuit diagram tool 12 is used for operating the virtually-produced circuit diagram so as to verify whether the operation corresponds to the design specification 21.

The layout diagram tool 13 is used for virtually producing a layout diagram for making an electronic circuit on a semiconductor substrate, based on the circuit diagram produced by the circuit diagram tool 12 and on layout rules 23 defined for realizing the relevant circuit on the semiconductor substrate. The layout diagram tool 13 is also used for virtually operating the virtually-produced layout diagram so as to verify whether the operation corresponds to the design specification 21. Here, the layout diagram means a plan or sectional view showing the entire structure or a part of the semiconductor substrate.

The test pattern tool 14 is used for producing a test pattern for testing the electronic circuit realized on the semiconductor substrate, based on the layout diagram which is produced by the layout diagram tool 13. The test pattern tool 14 produces the test pattern based on the layout diagram produced by the layout diagram tool 13, a test specification 24 which is prepared in advance, the design specification 21, the device parameters 22, the layout rules 23, and the like. The test pattern tool 14 is also used for applying the produced test pattern as an electronic signal to the electronic circuit realized on the semiconductor substrate.

The test result tool 15 receives results of the test using the test pattern which is applied by the test pattern tool 14, and communicates data in the results, which relates to a portion (or range) indicated by the analysis range (data) 25, to the test pattern tool 14, the layout diagram tool 13, the circuit diagram tool 12, and the logic diagram tool 11. Here, the test result is a signal measured by (i) making a probe needle directly contact a terminal or a wiring portion in the electronic circuit produced on the semiconductor substrate, or (ii) observing by using an electronic-beam tester.

The portion (or range) indicated by the analysis range 25 is, for example, a part of input terminals to be analyzed, or a process performed by one or more of the test pattern tool 14, the layout diagram tool 13, the circuit diagram tool 12, and the logic diagram tool 11.

The display device 17 receives data for determining a defective portion which causes failure, from the logic diagram tool 11 and the layout diagram 13, and shows the defective portion by using the logic diagram or the layout diagram. The display device 17 may receive such data from the circuit diagram tool 12 and show the defective portion by using the circuit diagram.

The simulator main portion 16 is a core tool for controlling the operations of the logic diagram tool 11, the circuit diagram tool 12, the layout diagram tool 13, the test pattern tool 14, the test result tool 15, and the display device 17. That is, the simulator main portion 16 determines conditions for input and determination, and the like, for virtually producing and operating a circuit to be simulated, for each of the above tools, and performs statistical calculation and combinational calculation for determining the defective portion which causes failure.

Accordingly, the analytic simulator 1 has a function of a design section (which is implemented in a design flow) for transferring data from the logic diagram tool 11 to the circuit diagram tool 12, the layout diagram 13, the test pattern tool 14, and the test result tool 15. The analytic simulator 1 also has a function of an analysis section (which is implemented in an analysis flow) for transferring data from the test result tool 15 to the test pattern tool 14, the layout diagram tool 13, the circuit diagram tool 12, and the logic diagram tool 11.

OPERATION OF EMBODIMENT

Below, the operation of the analytic simulator 1 will be explained with reference to FIGS. 1 to 3.

Figures 2, 3:
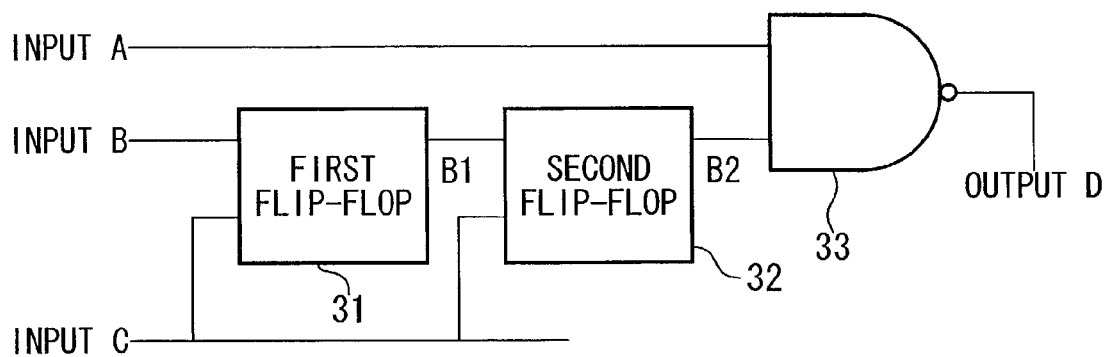
FIG. 2 is a circuit diagram showing an example of the object to be analyzed.
FIG. 3 is a truth table indicating expected output values for each test.

Here, the circuit shown in FIG. 2 is a target circuit to be analyzed, so as to overcome failure by using the analytic simulator 1. This target circuit is designed in the design flow of the analytic simulator 1, and is actually produced on a semiconductor substrate. Here, it is assumed that the target circuit includes a defective portion.

The target circuit consists of a first flip-flop 31, a second flip-flop 32, and a NAND circuit 33, and the circuit has three input terminals (input A, input B, and input C) and one output terminal (output D).

In order to design this target circuit, first, the logic diagram tool 11 of the analytic simulator 1 produces a logic diagram based on the design specification 21. The logic diagram tool 11 then performs logic operations by inputting different data (corresponding to different conditions) into the inputs A, B, and C in the produced logic diagram, and obtains the output D as the result of each operation, thereby producing a truth table as shown in FIG. 3. Therefore, the output D in FIG. 3 indicates output values (i.e., expected output values) when the target circuit of FIG. 2 has no failure.

The input conditions A, B, and C in FIG. 3 respectively correspond to inputs A, B, and C in FIG. 2, and these conditions are data used as operating conditions for the test pattern produced by the test pattern tool 14.

The logic diagram produced by the logic diagram tool 11 is transferred to the circuit diagram tool 12 and is developed as a circuit diagram. The circuit diagram developed by the circuit diagram tool 12 is then transferred to the layout diagram tool 13 and is further developed as a layout diagram. Based on this layout diagram, an actual semiconductor device is produced.

If the actually-produced semiconductor device has no failure, when the semiconductor device is operated by applying a test pattern, which is produced by the test pattern tool 14, into the inputs A, B, and C of the device, the same result as the expected output value as shown in FIG. 3 should be obtained at output D of the semiconductor device.

The test result tool 15 receives each test result (i.e., each value at output D) of the semiconductor device and compares the test result with the corresponding expected output value shown in FIG. 3.

If each test result coincides with the expected output value, the analytic simulator 1 determines that the semiconductor device has no failure, while if the test results include data which does not coincide with the corresponding expected output value, the analytic simulator 1 determines that the semiconductor device is defective.

If it is determined that the semiconductor device is defective, the analytic simulator 1 performs a process for determining and indicating a defective portion in the semiconductor device. This process will be explained below.

If the value "1" is applied to each of the inputs A, B, and C of the semiconductor device, as a test pattern, and the value "1" appears at output D, then this test result does not coincide with the expected output value E (i.e., 0) indicated in the last line of the truth table in FIG. 3. Therefore, in this case, the semiconductor device is defective.

The test result including data which indicates that the semiconductor device is defective is transferred from the test result tool 15 to the test pattern tool 14, the layout diagram tool 13, the circuit diagram tool 12, and the logic diagram tool 11, and is determined as an object to be analyzed in the analysis flow. Therefore, the simulator main portion 16 compares the test result with the logic diagram and the circuit diagram produced in the design flow, by using the logic diagram tool 11, the circuit diagram tool 12, and the like, so as to determine the defective portion in the logic diagram.

The simulator main portion 16 limits the analysis range to the case in which the value "1" is applied to each of the inputs A, B, and C, and sends the test pattern tool 14 a command for analyzing the test pattern. The test pattern tool 14 then determines that if both inputs B2 and A of the NAND circuit 33 have a value of 1, the output D of the NAND circuit 33 should have a value of 0, by referring to the last line of the truth table (see FIG. 3) and the circuit diagram (see FIG. 2). Accordingly, the simulator main portion 16 determines by using the logic diagram tool 11 and the circuit diagram 12 that the possibility that the wire line of the input A is defective is low because the input A is directly applied to the NAND circuit 33, and that the probability that the first flip-flop 31 or the second flip-flop 32 is defective is high.

Therefore, the simulator main portion 16 determines that it is necessary to check the output B2, that is, the output signal of the second flip-flop circuit 32, and makes the display device 17 show an indication for requesting the check of output B2. The display device 17 also shows data indicating that the possibility that the output B2 is defective is highest in comparison with other portions.

The simulator main portion 16 also makes the display device 17 show the position of the output B2 on the layout diagram via the layout diagram tool 13. Here, the simulator main portion 16 may make the display device 17 show the position of the output B2 on the circuit diagram via the circuit diagram tool 12.

The check of the output B2 is performed by referring to its position on the layout diagram shown by the display device 17; therefore, the check can be more easily and speedy performed in comparison with the other cases in which the layout diagram is not referred to.

More specifically, the portion corresponding to the output B2 on the semiconductor substrate is discovered by referring to the layout diagram shown by the display device 17, and (i) the probe needle is made to directly contact the wiring line of this portion so as to observe the signal in the "high" or "low" state, or (ii) the portion is observed by using an electronic-beam tester. Also in the checking operation of the output B2, the test pattern produced by the test pattern tool 14 is applied to the inputs B and C, and the observed value at the output B2 is input into the test result tool 15. The test result for the output B2 is then transferred from the test result tool 15 to the test pattern tool 14, the layout diagram tool 13, the circuit diagram tool 12, and the logic diagram tool 11.

If the confirmed result with respect to the output B2 differs from the expected output value, the simulator main portion 16 can determine by using the logic diagram tool 11, the circuit diagram tool 12, and the like that the first flip-flop 31 or the second flip-flop 32 is defective. Therefore, the simulator main portion 16 determines that the next target portion to be analyzed is output B1 and makes the display device 17 show a command for checking the output B1 and also show the position of the output B1 on the layout diagram.

Similar to the above-explained process for checking the output B2, the output B1 is checked. If the result of checking the output B1 coincides with the expected output value, the simulator main portion 16 determines that the first flip-flop 31 at the input side of the output B1 is not defective. In this case, the simulator main portion 16 determines that the second flip-flop 32 positioned between the outputs B1 and B2 is defective, The simulator main portion 16 then again performs the process for determining and showing the defective portion so as to determine and show a defective portion in the second flip-flop 32, and makes the display device 17 display an instruction for solving a problem relating to the design or any process.

The defective portion in the semiconductor substrate is then corrected by referring to the information shown by the display device 17. More specifically, such correction is performed, for example, by cutting a relevant wiring line or connecting relevant wiring lines by using a focused ion beam (FIB). Even if there are a plurality of defective portions (i.e., a plurality of problems), all the problems can be solved by repeating the determination of each defective portion and the correction of each defective portion.

Accordingly, problems of a circuit realized on a semiconductor substrate can be completely solved by using the analytic simulator 1, which repeatedly performs (i) production of simulated results (such as expected output values) in the design section through the design flow (or design process) and (ii) determination and display of a defective portion in the analysis section through the analysis flow (or analysis process).

According to the present embodiment, the analytic simulator 1 can determine the logic element which causes inconsistency between the test result and the expected output value based on (i) the test results (i.e., observed values) received by the test result tool 15, (ii) the analysis range 25, (iii) each test pattern produced by the test pattern tool 14, and (iv) data about the logic diagram (including the expected output values), the circuit diagram, and the layout diagram which are respectively produced by the logic diagram tool 11, the circuit diagram tool 12, and the layout diagram tool 13. In order to determine the defective portion, the analytic simulator 1 defines the input condition (i.e., test pattern) for each logic circuit (portion) in the target circuit to be analyzed, based on the data indicating a problem in the test results, and calculates a logic element which produces the logic output corresponding to the test result which indicates a defect. The analytic simulator 1 determines that in the calculated logic element, a portion which does not coincide with the expected output value is the defective portion. The analytic simulator 1 then displays the defective portion on the logic diagram and the layout diagram.

In some kinds of circuits, the defective portion cannot be determined only by the states of the outputs (i.e., observed values). For example, in FIG. 3, there are a plurality of patterns as the input conditions which produce a value of 1 at the output D; thus, it is impossible to estimate the defective portion only by checking the output D. Therefore, the input conditions (i.e., inputs A, B, and C), which are used for producing each test pattern by the test pattern tool 14, are also referred to, so as to narrow the input conditions and find an input condition corresponding to the test result which indicates failure, so that the defective portion is estimated or determined. For example, the input conditions are narrowed down by observing and checking the output B2.

A program for performing the functions of the analytic simulator 1 in the present embodiment, as shown by FIGS. 1 to 3, may be stored in a computer system and executed by the computer system, so as to implement each function. The computer system includes an operating system and hardware resources such as peripheral devices.

When the computer system uses a WWW (world wide web) system, the relevant environment for providing or displaying homepages are also included in the computer system.

The above program may be transmitted from the computer system (which stores the program in a storage device or the like) via a transmission medium (on transmitted waves through the transmission medium) to another computer system. The transmission medium through which the program is transmitted is a network such as the Internet or a communication line such as a telephone line, that is, a medium which has a function for transmitting data.

In addition, a program for performing a portion of the above-explained functions may be used. Furthermore, a differential file (i.e., a differential program) to be combined with a program which has already been stored in the computer system may be provided for realizing the above functions.

An embodiment according to the present invention has been explained in detail. However, concrete examples of the present invention are not limited to the embodiment; other variations or design modifications within the scope and spirit of the present invention are possible.

For example, in the above embodiment, the processes in the design flow in order of the logic diagram tool 11→the circuit diagram tool 12→the layout diagram tool 13→the test pattern tool 14→the test result tool 15 (i.e., from the upstream to the downstream side) are performed so that a defect is detected by the test result tool 15, and then the processes in the analysis flow in order of the test result tool 15→the test pattern tool 14→the layout diagram tool 13→the circuit diagram tool 12→the logic diagram tool 11 (i.e., from the downstream to the upstream side) are performed. However, the present invention is not limited in this arrangement, and the design flow or the analysis flow may be repeated within a shorter cycle. For example, when a problem is found in the design or analysis flow, the operation may immediately go back (e.g., return to the upstream or downstream side) so as to investigate the cause of the problem, and then the operation is continued again along the flow.

What is claimed is:

1. An analytical simulator for designing and analyzing a semiconductor device, comprising:
    a design section for designing the semiconductor device based on predetermined design data including design specification data;
    a test result tool for receiving results of a test on the semiconductor device as an object to be analyzed, the semiconductor device being designed by the design section and manufactured based on the design;
    an analysis section for comparing each test result with an expected output value of the object to be analyzed, where the expected output value is calculated by the design section, and for determining an area in the object to be analyzed, which includes a defective portion, based on results of the comparison; and
    a display device for displaying the area including a defective portion, which is determined by the analysis section, using at least one of a logic diagram, a circuit diagram and a layout diagram, wherein the display device also displays a probability that the displayed area includes a defect.

2. The analytical simulator as claimed in claim 1, wherein the design section includes a test pattern tool for producing a test pattern used in the test which is performed in the area determined by the analysis section;
    the test result tool also receives data for indicating a limited area to be analyzed in the object; and wherein
    the analysis section comprises at least one component of the design section and compares the test result with the expected output value of the limited area indicated by the data received by the test result tool.

3. The analytical simulator as claimed in claim 2, wherein the design section includes:
    a logic diagram tool for producing a logic diagram based on the design specification data;
    a circuit diagram tool for producing a circuit diagram based on the logic diagram and on predetermined device parameters for manufacturing the semiconductor device;
    a layout diagram tool for producing a layout diagram based on the circuit diagram, and on predetermined layout rules;
    the test pattern tool; and
    the test result tool;
    wherein the analysis section includes at least one of the logic diagram tool, the circuit diagram tool, the layout diagram tool, the test pattern tool, and the test result tool;
    wherein the logic diagram tool produces the logic diagram of the object to be analyzed, based on the area determined by the analysis section; and
    wherein the layout diagram tool produces the layout diagram of the object to be analyzed, based on the area determined by the analysis section.

4. An analytical simulation method for designing and analyzing a semiconductor device, the method comprising the steps of:
    designing the semiconductor device based on predetermined design data including design specification data;
    manufacturing the semiconductor device based on the semiconductor device designed during the designing step;
    receiving results of a test on the semiconductor device as an object to be analyzed;

comparing each test result with an expected output value of the object to be analyzed, the expected output value being calculated in the designing step;

determining an area in the object to be analyzed, which includes a defective portion, based on results of the comparison; and displaying the area including a defective portion, which is determined in the determining step, using at least one of a logic diagram, a circuit diagram and a layout diagram, wherein the displaying step includes displaying a probability that the displayed area includes a defect.

5. The analytical simulation method as claimed in claim 4, wherein the designing step includes the steps of:

producing a logic diagram based on the design specification data; producing a circuit diagram based on the logic diagram and on predetermined device parameters for manufacturing the semiconductor device;

producing a layout diagram based on the circuit diagram and on predetermined layout rules;

producing a test pattern for use in the test, based on at least one of the design specification data, the logic diagram, the device parameters, the circuit diagram, the layout rules, the layout diagram, predetermined data relating to specification of the test; and the step of receiving results of a test on the semiconductor device;

wherein the test result receiving step includes also receiving data for indicating a limited area to be analyzed in the object;

wherein the comparing step includes comparing the test result with the expected output value in the limited area by using the predetermined design data used in the designing step and data produced in the designing step, determining the area including a defective portion based on results of the comparison, and displaying the area by using at least one of the logic diagram, the circuit diagram, and the layout diagram; and wherein the comparing step and the designing step, which includes the test result receiving step, are repeatedly performed by defining the displayed area as the object to be analyzed.

6. An analytical simulation program for designing and analyzing a semiconductor device, the program causing a computer to execute an operation comprising the steps of:

designing the semiconductor device based on predetermined design data including design specification data;

receiving results of a test on the semiconductor device as an object to be analyzed, the semiconductor device being designed in the designing step and manufactured based on the design;

comparing each test result with an expected output value of the object to be analyzed, the expected output value being calculated in the designing step; and determining an area in the object to be analyzed, which includes a defective portion, based on results of the comparison;

displaying the area including a defective portion, which is determined in the determining step, using at least one of a logic diagram, a circuit diagram and a layout diagram, wherein the displaying step includes displaying a probability that the displayed area includes a defect.

7. The analytical simulation program as claimed in claim 6, wherein the operation further comprises the step of:

manufacturing the semiconductor device based on the design of said designing step.

8. The analytical simulation program as claimed in claim 6, wherein the designing step includes the steps of:

producing a logic diagram based on the design specification data;

producing a circuit diagram based on the logic diagram and on predetermined device parameters for manufacturing the semiconductor device;

producing a layout diagram based on the circuit diagram and on predetermined layout rules;

producing a test pattern for use in the test, based on at least one of the design specification data, the logic diagram, the device parameters, the circuit diagram, the layout rules, the layout diagram, and predetermined data relating to specification of the test; and the step of receiving test results of a test on the semiconductor device;

wherein the test result receiving step includes also receiving data for indicating a limited area to be analyzed in the object;

wherein the comparing step includes comparing the test result with the expected output value in the limited area using the predetermined design data used in the designing step and data produced in the designing step, determining the area including a defective portion based on results of the comparison, and displaying the area by using at least one of the logic diagram, the circuit diagram, and the layout diagram; and wherein the comparing step and the designing step, which includes the test result receiving step, are repeatedly performed by defining the displayed area as the object to be analyzed.

* * * * *